United States Patent [19]
Bazes

[11] Patent Number: 5,583,458
[45] Date of Patent: Dec. 10, 1996

[54] PHASE DETECTOR WITH EDGE-SENSITIVE ENABLE AND DISABLE

[75] Inventor: Mel Bazes, Haifa, Israel

[73] Assignee: Intel Corporation, Santa Clara, Calif.

[21] Appl. No.: 433,810

[22] Filed: May 3, 1995

[51] Int. Cl.⁶ .................................................. H03D 13/00
[52] U.S. Cl. ..................................... 327/3; 327/12; 327/7
[58] Field of Search .................................. 327/2, 3, 5, 7, 327/8, 9, 12

[56] References Cited

U.S. PATENT DOCUMENTS

| | | | |
|---|---|---|---|
| 4,222,013 | 9/1980 | Bowers et al. | 327/12 |
| 4,496,861 | 1/1985 | Bazes . | |
| 4,546,486 | 10/1985 | Evans | 327/5 |
| 5,036,230 | 7/1991 | Bazes . | |
| 5,136,253 | 8/1992 | Ueno | 327/12 |
| 5,138,188 | 8/1992 | Bazes . | |
| 5,289,518 | 2/1994 | Nakao | 327/218 |
| 5,317,202 | 5/1994 | Waizman | 327/156 |
| 5,386,437 | 1/1995 | Yasuda | 327/7 |
| 5,408,200 | 4/1995 | Buhler | 327/156 |

*Primary Examiner*—Timothy P. Callahan
*Assistant Examiner*—Eunja Shin
*Attorney, Agent, or Firm*—Blakely, Sokoloff, Taylor & Zafman

[57] ABSTRACT

An integrated circuit utilizing a symmetric phase detection circuit for detecting a phase relationship between a reference clock signal and a delayed clock signal. The integrated circuit described herein features a control block circuit coupled to receive the reference clock signal and an enable check signal. The control block circuit generates an enable signal which provides the present invention with the ability to detect the phase difference between signals having the same frequency or signals that differ in frequency by a rational factor. The control block circuit generates the enable signal in response to the enable check signal and the reference clock signal. The enable signal, the reference clock signal, and the delayed clock signal are coupled to the phase detection circuit. In response to the enable signal, the phase detection circuit then determines the phase relationship between the reference clock signal and delayed clock signal.

49 Claims, 6 Drawing Sheets

FIG_1 (PRIOR ART)

FIG_2 (PRIOR ART)

FIG_3 (PRIOR ART)

FIG_4 (PRIOR ART)

FIG_5

FIG. 6

FIG_7

FIG_9

FIG_11

PHASE DETECTOR WITH EDGE-SENSITIVE ENABLE AND DISABLE

I. BACKGROUND OF THE INVENTION

A. Field of the Invention

This invention relates to digital waveform processing and, more particularly, to phase detection between two digital waveforms.

B. Description of the Prior Art

In phase-locked systems, phase detectors are commonly used in feedback loops to determine the phase relationship between clocks such as a reference clock and a delayed clock. Using phase detectors to detect the phase differences between the reference clock and the delayed clock, negative feedback can be used to null differences in phase between the two clock signals.

If a digital phase detector senses that the delayed clock precedes the reference clock, the delayed clock has negative phase with respect to the reference clock and is therefore said to lead the reference clock. Conversely, if the digital phase detector senses that the delayed clock follows the reference clock, the delayed clock has positive phase with respect to the reference clock and is therefore said to lag the reference clock.

Accordingly, digital phase detectors generally receive two inputs, REFCLK and DLYCLK, which correspond with the reference clock and delayed clock signals. Furthermore, digital phase detectors often generate two outputs, LEAD and LAG, which correspond with negative and positive phase relationships between the two input signals, respectively. When there is a negative phase relationship between the two input signals, i.e. the delayed clock precedes the reference clock, the digital phase detector outputs an active LEAD signal or an inactive LAG signal. On the other hand, when there is a positive phase relationship between the two input signals, i.e. the reference clock precedes the delayed clock, the digital phase detector outputs an active LAG signal or an inactive LEAD signal.

An important characteristic of an ideal digital phase detector is identical processing for each of the two input signals. Identical processing, or perfect symmetry, is necessary in order to minimize the possibility of introducing any errors into phase measurements between the two inputs, REFCLK and DLYCLK. If a digital phase detector has asymmetric processing for the REFCLK and DLYCLK inputs, incorrect LEAD and LAG outputs may be generated by the phase detector. In contrast, an ideal digital phase detector with perfectly symmetric processing should introduce minimal error into phase measurements between the two inputs, even when the phase differences between the two signals are very small.

Many prior art digital phase detectors suffer from effects associated with their lack of symmetric circuitry. As a result, these prior art phase detectors inadvertently introduce errors into their phase measurements which may result in incorrect LEAD and LAG outputs.

Other prior art digital phase detectors may have symmetric circuitry, but these phase detectors have limited usefulness since their LEAD and LAG outputs are only valid for fractions of a clock period. In addition, many of these prior art detectors are limited to detecting phase differences between input waveforms which have the same frequency. Digital waveform synthesizers, such as the one described in pending patent application, Ser. No. 08/394,174, filed on Feb. 24, 1995 and entitled "DELAY INTERPOLATION CIRCUITRY," require digital phase detectors capable of detecting phase differences between input waveforms having different frequencies.

Therefore, a digital phase detector having symmetric circuitry, having LEAD and LAG outputs that are valid for an entire clock period, and capable of detecting phase differences between input waveforms having different frequencies is desired.

II. SUMMARY OF THE INVENTION

An integrated circuit for detecting a phase relationship between a reference clock signal and a delayed clock signal is described. With the present invention, the phase difference between the reference clock signal and the delayed clock signal is detected with a circuit having symmetric processing for the two input signals, including a symmetric phase detection circuit. In addition, the integrated circuit described herein features a control block circuit coupled to receive the reference clock signal and an enable check signal which provides the present invention the ability to detect phase differences between signals having the same frequency, or signals that differ in frequency by a rational factor. The symmetric phase detection circuit featured by the present invention is coupled to receive the reference clock signal, the delayed clock signal, and an enable signal. The enable signal is generated by the control block circuit in response to the enable check signal and the reference clock signal. The enable signal is activated by one of the enable check signal edges, and is deactivated by one of the reference clock signal edges. Therefore, the phase detector detection cycle is insensitive to the high and low times of the enable check signal and reference clock signals. In response to the enable signal, the symmetric phase detection circuit determines the phase relationship between the reference clock signal and delayed clock signal.

IV. DETAILED DESCRIPTION

A digital phase detector having symmetric circuitry, having LEAD and LAG outputs that are valid for an unlimited amount of time, and capable of detecting phase differences between two input waveforms having different frequencies is described. In the following description, numerous specific details are set forth such as specific circuits in order to provide a thorough understanding of the present invention. The present invention, however, may be practiced without these specific details. In other instances, the details of well-known circuitry are not shown here in order not to obscure the present invention unnecessarily.

Figure 1:
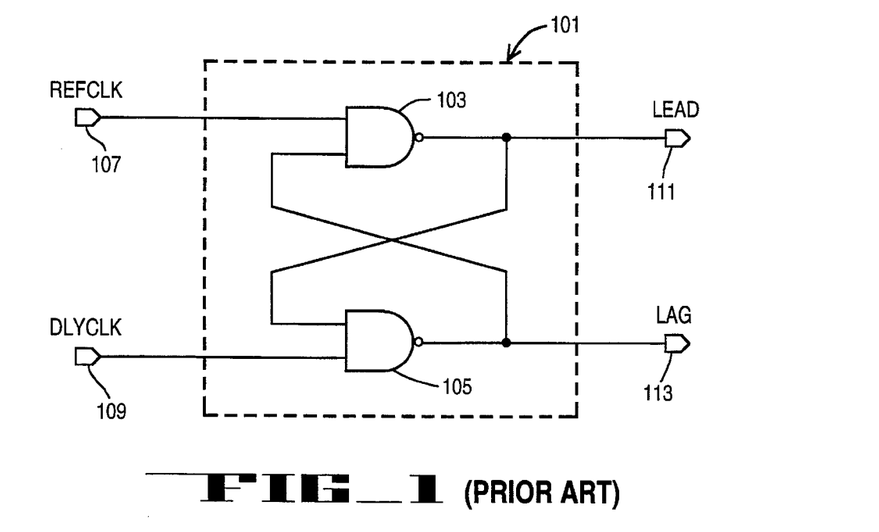
FIG. 1 is a schematic of a prior art set-reset flip-flop used as a digital phase detector.

FIG. 1 is an illustration of a prior art digital phase detector 101 which is implemented using a simple set-reset flip-flip that satisfies the perfect symmetry requirements. Prior art phase detector 101 is comprised of a pair of cross-coupled logical-NAND gates 103 and 105. The set input 107 receives the reference clock signal, REFCLK, and the reset input 109 receives the delayed clock signal, DLYCLK. The lead signal, LEAD, is generated at output 111 and the lag signal, LAG, is generated at output 113.

Figure 2:
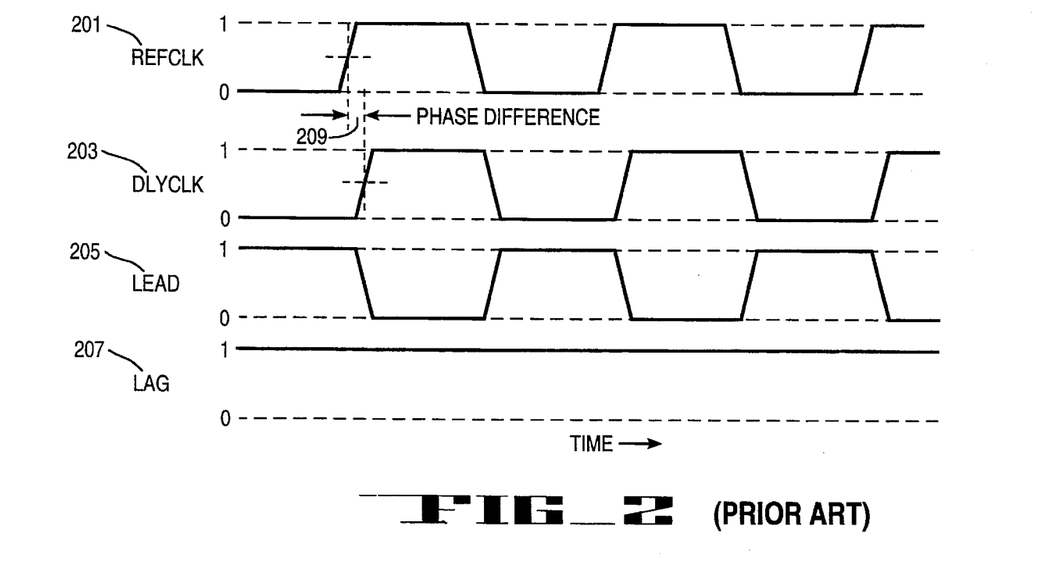
FIG. 2 is a timing diagram showing the relationship between two waveforms and the corresponding output waveforms of a prior art digital phase detector.

Operation of prior art phase detector 101 can be observed in FIG. 2. When both REFCLK 201 and DLYCLK 203 are at a low level, both the LEAD 205 and LAG 207 outputs are at a high level. If REFCLK 201 goes high before DLYCLK 203, i.e., DLYCLK 203 lags REFCLK 201, LEAD 205 is changed to a low level as soon as REFCLK 201 goes high and LAG 207 remains at a high level. When DLYCLK 203 subsequently goes to a high level, as shown in FIG. 2, LEAD 205 and LAG 207 output levels remain unchanged. As soon as either of the REFCLK 107 and DLYCLK 109 inputs go low, however, LEAD 111 and LAG 113 outputs are invalid. As a consequence, prior art phase detector 101 is limited in its usefulness since LEAD 111 and LAG 113 are valid only for the fraction of a clock period before either REFCLK 107 and DLYCLK 109 go low.

Figure 3:
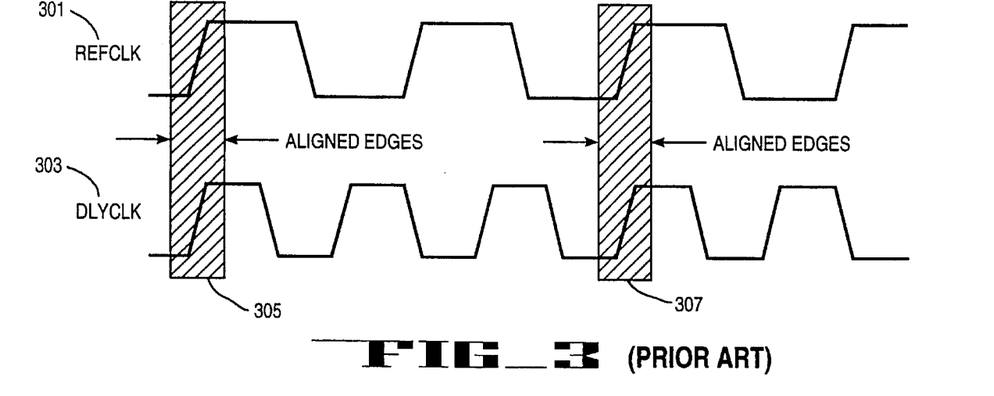
FIG. 3 is a timing diagram showing two waveforms that differ in frequency by a rational factor (2:3 in this diagram).

An additional shortcoming with prior art phase detector 101 is that there is no control over which of the input edges are checked for phase detection. More specifically, if the waveforms input at REFCLK 107 and DLYCLK 109 differ in frequency by a rational factor, then the phase difference between the two input waveforms should only be measured at specific edges, or the aligned edges. The waveforms should not be measured at all edges indiscriminately for phase differences. FIG. 3 is an illustration of two waveforms REFCLK 301 and DLYCLK 303 which differ in frequency by a ratio of 2:3. Note that aligned edges 305 and 307 occur only periodically and that the other edges are not aligned. Therefore, for the purpose of phase detection, REFCLK 301 and DLYCLK 303 should only be examined at aligned edges 305 and 307 since it is known that the other edges will not be aligned.

Figure 4:
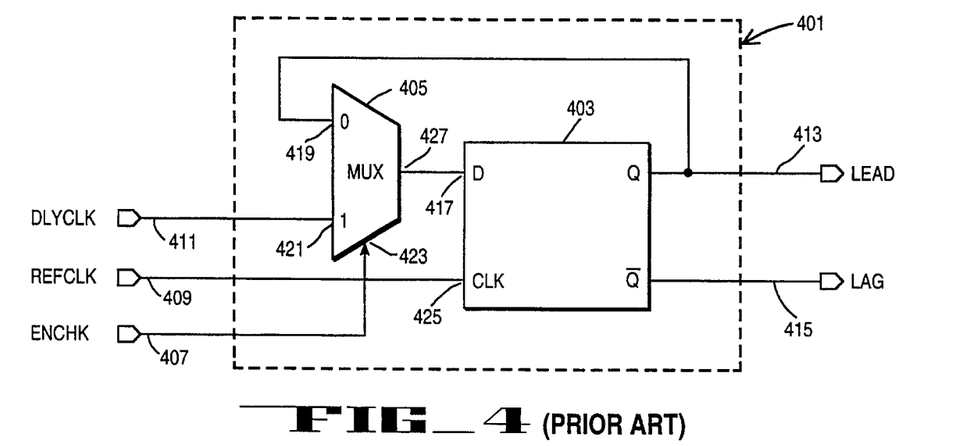
FIG. 4 is a block diagram of a prior art digital phase detector using a conventional edge-triggered latch circuit.

FIG. 4 illustrates an alternative prior art phase detector 401 capable of detecting phase differences between two input waveforms having different frequencies, such as those illustrated in FIG. 3. Prior art phase detector 401 implements a conventional edge-triggered latch including a D-type flip-flop 403 and multiplexor 405. The D-type flip-flop 403 outputs LEAD 413 and LAG 415 signals. Enable check signal, ENCHK 407, is coupled to 2-1 multiplexor selector input 423. Reference clock signal, REFCLK 409, is coupled to the D-type flip-flop CLK input 425. Delayed clock signal, DLYCLK 411, is coupled to one of the 2-1 multiplexor inputs 421 and the LEAD 413 output is fed back to the other one of the 2-1 multiplexor's inputs 419. Multiplexor 405 output 427 is coupled to the D 417 input of flip-flop 403.

When ENCHK 407 is high, multiplexor 405 outputs DLYCLK 411 to the D 417 input of flip-flop 403. Accordingly, the rising edge of REFCLK 409 samples the DLYCLK 411 input. If, for example, DLYCLK 411 leads REFCLK 409, then DLYCLK 411 is high on a rising edge of REFCLK 411. Thus, an active signal, or high value, is output at LEAD 413 and an inactive signal, or low value, is output at LAG 415. When ENCHK 407 is low, multiplexor 405 feeds back the LEAD 413 signal to the D 417 input of flip-flop 403. Hence, when ENCHK 407 is low, flip-flop 403 does not sample DLYCLK 411. Instead, LEAD 413 is fed back into flip-flop 403 through multiplexor 405 and the LEAD 413 and LAG 415 outputs are stable and remain fixed in their previous states.

Thus, if ENCHK 407 is high only during aligned edges 305 of the two waveforms 301 and 303 of FIG. 3, prior art phase detector 401 is able to detect phase differences between the two input waveforms 301 and 303 differing in frequency by a rational factor. Furthermore, unlike prior art phase detector 101, the outputs of phase detector 401 are not invalid as soon as one of the two input waveforms go low.

Prior art phase detector 401, however, does not have the necessary characteristic of symmetry between inputs REFCLK 409 and DLYCLK 411. In order to be symmetric, phase detector 401 must process the REFCLK 409 and DLYCLK 411 inputs identically. Prior art phase detector 401 does not process REFCLK 409 and DLYCLK 411 symmetrically as DLYCLK 411 is coupled to multiplexor 405 and REFCLK 409 is coupled to CLK 425 of D-type flip-flop 403. Moreover, D 417 inputs are generally asymmetric with respect to the CLK 425 inputs of standard D-type flip-flops 403, thereby resulting in increased asymmetry between the REFCLK 409 and DLYCLK 411 inputs. Therefore, prior art phase detector 401 is also a less than desirable phase detector.

Figure 5:
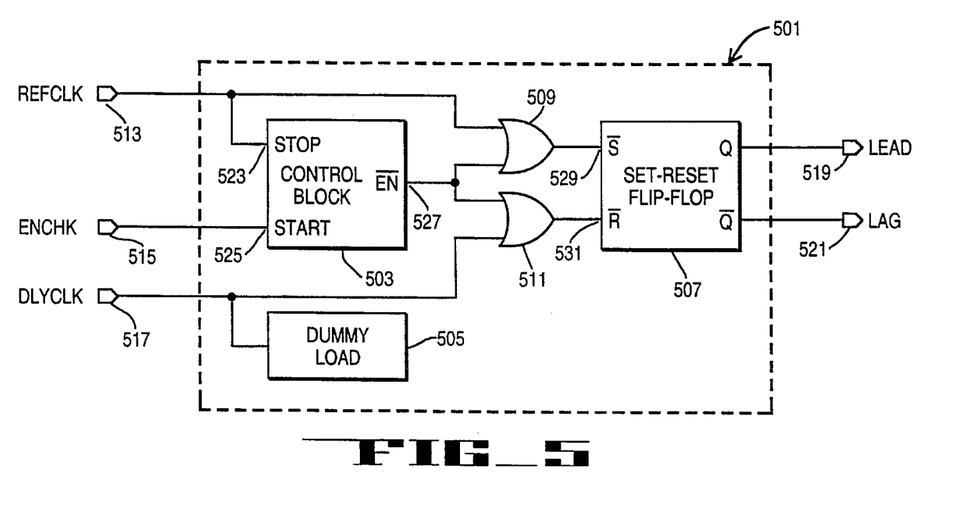
FIG. 5 is a block diagram of the presently preferred digital phase detector with edge-sensitive enable and disable.

FIG. 5 is a block diagram of the presently preferred embodiment of a phase detector 501 with an edge-sensitive enable and disable. A reference clock signal, REFCLK 513, a delayed clock signal, DLYCLK 517, and an enable check signal, ENCHK 515, are input to the phase detector 501 and corresponding LEAD 519 and LAG 521 signals are output by phase detector 501. Phase detector 501 includes a control block circuit 503 which provides an active low enable signal, $\overline{EN}$ 527, to a set-reset flip-flop 507 through logical-OR gates 509 and 511. The set-reset flip-flop 507 has active low inputs $\overline{S}$ 529 (set) and $\overline{R}$ 531 (reset), and is equivalent to prior art phase detector 101. $\overline{S}$ 529 receives input from logical-OR gate 509 and $\overline{R}$ 531 receives input from logical-OR gate 511. Logical-OR gate 509 is coupled to receive input from REFCLK 513 and $\overline{EN}$ 527, and logical-OR gate 511 is coupled to receive input from DLYCLK 517 and $\overline{EN}$ 527. Control block circuit 503 is coupled to receive REFCLK 513 as input at STOP 523, and ENCHK 515 as input at START 525. In order to equalize the parasitic loads on the input two signals REFCLK 513 and DLYCLK 517, dummy load 505 is attached to DLYCLK 517.

Operation of phase detector 501 is as follows. Control block 503 maintains $\overline{EN}$ 527 as inactive, or at a high logic level, until a low to high level transition is received on the ENCHK 515 line. With $\overline{EN}$ 527 at a high logic level, the $\overline{S}$ 529 and $\overline{R}$ 531 inputs receive high logic levels from logical-OR gates 509 and 511, irrespective of the input signals on REFCLK 513 and DLYCLK 517. Thus, with both $\overline{S}$ 529 and $\overline{R}$ 531 receiving high logic levels, the set-reset flip-flop 503 maintains its previous state indefinitely, and the LEAD 519 and LAG 521 output signals are therefore stabilized.

When a low to high logic level transition is detected at ENCHK 515, control block circuit 503 then outputs an active, or low logic level, at $\overline{EN}$ 527. Accordingly, logical-OR gates 509 and 511 receive "0's" from $\overline{EN}$ 527, and the set-reset flip-flop 507 inputs $\overline{S}$ 529 and $\overline{R}$ 531 are therefore able to sample the REFCLK 513 and DLYCLK 517 signals. Control block 503 is unable, however, to deactivate $\overline{EN}$ 527 back to a "1" until a low to high level transition is thereafter detected on REFCLK 513. Thus, control block circuit 503 then monitors REFCLK 513 for a low level logic signal. When the low level logic signal is detected on REFCLK 513, phase detection between REFCLK 513 and DLYCLK 517 continues, and the LEAD 519 and LAG 521 output signals are updated accordingly.

A subsequent low level to high level transition of REFCLK 513 captures the existing status of the LEAD 519 and LAG 521 output signals. If the waveform on DLYCLK 517 is at a high logic level, or has a low to high logic level transition before REFCLK 513 has the low to high logic level transition, then the LEAD 519 output is set to a high logic level and the LAG 521 output is set to a low logic level. In this instance, the waveform on DLYCLK 517 leads the waveform on REFCLK 513. On the other hand, if there is a low to high logic level transition on REFCLK 513 before there is a low logic level to high logic level transition on DLYCLK 517, then the LEAD 519 output is set to a low logic level and the LAG 521 output is set to a high logic level. In this instance, the waveform on DLYCLK 517 lags the waveform on REFCLK 513.

After control block circuit 503 detects the low to high logic level transition on REFCLK 513, control block circuit 503 deactivates $\overline{EN}$ 527 by raising it from a low to a high logic level. As a result, logical-OR gates 509 and 511 receive "1's" from $\overline{EN}$ 527, and set-reset flip-flop 507 therefore stops sampling the REFCLK 513 and DLYCLK 517 waveforms at the $\overline{S}$ 529 and $\overline{R}$ 531 inputs. Accordingly, LEAD 519 and LAG 521 outputs remain fixed at their respective values at the time of the low to high level transition of REFCLK 513 until the next low to high level transition of ENCHK 515.

Thus, presently preferred phase detector 501 processes the REFCLK 513 and DLYCLK 517 signals with perfect symmetry. In addition, the phase relationship between REFCLK 513 and DLYCLK 517 is sensed only at selected intervals by set-reset flip-flop 507 in response to transitions on ENCHK 515 and REFCLK 513. Hence, the use of ENCHK 515 enables phase detector 501 to detect phase differences between input waveforms differing in frequency by a rational factor, such as edges 305 in waveforms 301 and 303 of FIG. 3. Another feature of the present invention is that the outputs LEAD 519 and LAG 521 of phase detector 501 are not invalid as soon as one of the two inputs REFCLK 513 or DLYCLK 517 go low. Instead, LEAD 519 and LAG 521 remain valid indefinitely until a subsequent low to high transition on ENCHK 515. Presently preferred phase detector 501 is more flexible than prior art phase detector 401 since phase detector 501 only requires a low to high logic level transition of ENCHK 515 to enable sampling. Prior art phase detector 401 requires ENCHK 407 to remain at a high logic level for the entire duration in which sampling is to take place. In contrast, presently preferred phase detector 501 only requires a low to high logic level transition of ENCHK 515 and is insensitive to the length of the ENCHK 515 pulse. Prior art phase detector 401, on the other hand, is very sensitive to the length of the ENCHK 407 pulse.

Figure 6:
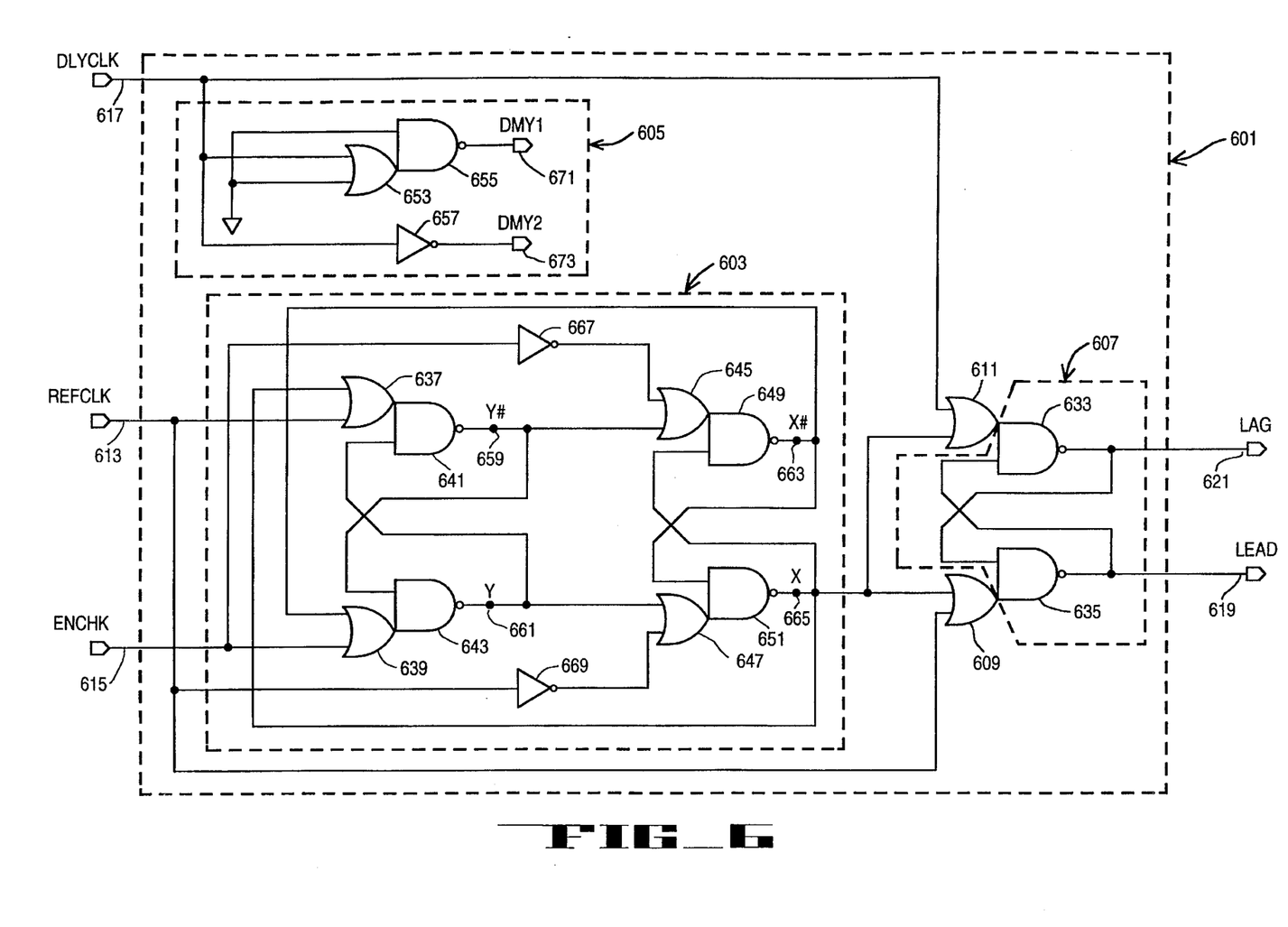
FIG. 6 is a schematic of the presently preferred embodiment of a digital phase detector with edge-sensitive enable and disable.

A schematic of the presently preferred phase detector 601 is shown in FIG. 6. This particular schematic is one of several possible implementations of the present invention. Control block circuit 603 includes two pairs of cross-coupled logical-NAND gates, 641 and 643, and 649 and 651. Logical-NAND gate 641 is also coupled to receive the output of logical-OR gate 637, and logical-NAND gate 643 is also coupled to receive the output of logical-OR gate 639. Logical-OR gate 637 is coupled to receive REFCLK 613 and the output of logical-NAND gate 651, and logical-OR gate 639 is coupled to receive ENCHK 615 and the output of logical-NAND gate 649. Logical-NAND gate 649 is also coupled to receive the output of logical-OR gate 645, and logical-NAND gate 651 is also coupled to receive the output of logical-OR gate 647. Logical-OR gate 645 is coupled to receive the outputs of logical-NAND gate 641 and logical-NOT gate 667. Logical-OR gate 647 is coupled to receive the outputs of logical-NAND gate 643 and logical-NOT gate 669. Logical-NOT gate 669 is coupled to receive REFCLK 613 and logical-NOT gate 667 is coupled to receive ENCHK 615.

As shown in FIG. 6, the output of logical-NAND gate 641 is denoted to be node Y#659, the output of logical-NAND gate 643 is denoted to be Y 661, the output of logical-NAND gate 649 is denoted to be X#663, and the output of logical-NAND gate 651 is denoted to be X 665. The output of logical-NAND gate 651 also corresponds with $\overline{EN}$ 527 of FIG. 5. Accordingly, the output of logical-NAND gate 651 is coupled to inputs of logical-OR gates 609 and 611. Logical-OR gate 609 is also coupled to receive REFCLK 613 and logical-OR gate 611 is further coupled to receive DLYCLK 617.

Set-reset flip-flop 607 includes cross-coupled logical-NAND gates 633 and 635. Logical-NAND gate 633 is also coupled to receive the output of logical-OR gate 611, and logical-NAND gate 635 is also coupled to receive the output of logical-OR gate 609. LAG 621 is output by logical-NAND gate 633, and LEAD 619 is output by logical-NAND gate 635.

Dummy load 605 is implemented using logical-OR, NAND, and NOT gates 653, 655, and 657, respectively. DLYCLK 617 is coupled to the inputs of logical-OR gate 653 and logical-NOT gate 657. The output of logical-OR gate 653 is coupled to an input of logical-NAND gate 655. An input of logical-NAND gate 655 and an input of logical-OR gate 653 are also coupled to $V_{ss}$. The outputs of logical-NAND gate 655 and logical-NOT gate 657, DMY1 671 and DMY2 673, respectively, are unused.

The logical-OR, NAND, and NOT gates 653, 655, and 657 used in dummy load 605 to load DLYCLK 617 are a replica of logical-OR, NAND, and NOT gates 637, 641, and 669, which are coupled to REFCLK 613. An analysis of control block circuit 603 reveals that the inputs to logical-OR gate 637 and logical-NAND gate 641 that are not connected to REFCLK 613 are at a low level before, and slightly after, REFCLK 613 makes a low level to high level transition. This particular low to high level transition of REFCLK 613 is "critical" since it is at this transition that causes the enable signal, $\overline{EN}$ 527, to be deactivated thereby locking in the result of the phase comparison into the phase detector outputs, LEAD 619 and LAG 621.

In order for logical-OR, NAND, and NOT gates 653, 655, and 657 to load DLYCLK 617 exactly the same as logical- OR, NAND, and NOT gates 637, 641, and 669 load REFCLK 613, the inputs to gates 653, 655, and 657 are coupled to the same logic levels as are the corresponding inputs of gates 637, 641, and 669 during the "critical" transition. As shown in FIG. 6, node Y 661 is coupled to an input of logical-NAND gate 641, and node X 665 is coupled to an input of logical-OR gate 637. During the "critical" transition, both nodes Y 661 and X 665 are at low levels, or Y 661="0" and X 665="0". Accordingly, the corresponding inputs to logical-OR gate 653 and logical-NAND gate 655 of dummy load 605 that are not connected to DLYCLK 617 are coupled to a low logic level, or $V_{ss}$. Thus, the parasitic load on DLYCLK 617 created by logical-OR, NAND, and NOT gates 653, 655, and 657 is identical to the parasitic load on REFCLK 613 created by logical-OR, NAND, and NOT gates 637, 641, and 669 during the "critical" transition.

Figure 7:
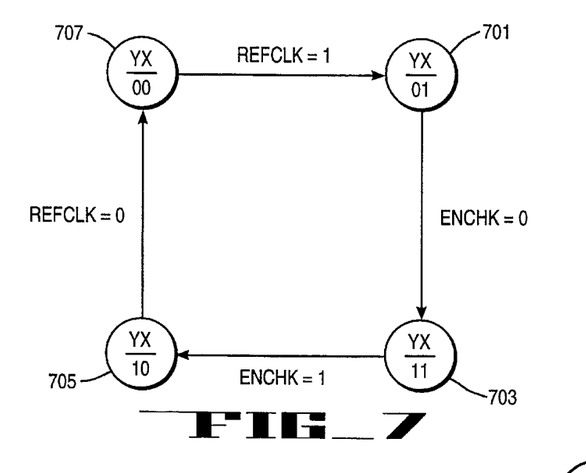
FIG. 7 is a state-transition diagram for the presently preferred digital phase detector.

Control block 603 of the presently preferred phase detector 601 is implemented as an asynchronous state machine whose operation can be understood with reference to the state-transition diagram of FIG. 7. The diagram includes four possible states of the control logic denoted by circles 701, 703, 705, and 707. The states represented by circles 701, 703, 705, and 707 contain the values for Y 661 and X 665. The logic levels at nodes Y 661 and X 665 of FIG. 6 at a particular time are considered as the corresponding state variables for the state-transition diagram of FIG. 7. The arrows between each of the circles indicate possible state transitions with corresponding input signal values for ENCHK 615 and REFCLK 613 which will cause the transition indicated by the associated arrow.

As shown in FIG. 7, control block 603 transitions from state 701 to state 703 when a low logic level is detected on ENCHK 615, or ENCHK 615=0. While in state 701, Y 661 is at a low logic level, or Y 661=0, and X 665 is at a high logic level, or X 665=1. After control block 603 transitions to state 703, Y 661=1 and X 665=1. Control block 603 transitions to state 705 when a high logic level is detected on ENCHK 615, or ENCHK 615=1. While in state 705, Y 661=1 and X 665=0. Control block 603 transitions to state 707 when a low level signal is detected on REFCLK 613, or REFCLK 613=0. While in state 707, Y 661=0 and X 665=0. Finally, control block 603 then transitions back to state 701 when a high logic level is detected on REFCLK 613, or REFCLK 613=1.

Thus, it is observed that X 665 transitions from high to low when there is a low to high transition of ENCHK 615. Further, X 665 transitions from low back to high when there is a low to high transition on REFCLK 613. Accordingly, X 665 of phase detector 601 is therefore equivalent to the EN 527 output of control block 503.

In light of the state-transition diagram of FIG. 7, the "critical" transition in which phase detection results are locked into the LEAD 619 and LAG 621 occurs at the state represented by circle 707, where Y 661="0" and X 665="0".

Further analysis of phase detector 601 shows that the capacitive loading on REFCLK 613 changes as a function of machine state. In particular, the capacitive loading presented by a complex logic gate on one of its inputs is a function of the logic levels at the other inputs. For example, logical-OR and NAND gates 637 and 641 of FIG. 6 load REFCLK 613 more when the signal present at node Y 661 is high than when it is low. Specifically, when the signal present at node Y 661 is high, and the signal at node X 665 is low, a low to high transition of REFCLK 613 results in a high to low transition at node Y#659. This high to low transition at node Y#659, through capacitive coupling between output node Y#659 and input REFCLK 613 creates a Miller-effect increase in capacitive loading on REFCLK 613. If, on the other hand, the signal present at node Y 661 is low, a low to high transition of REFCLK 613 does not result in a transition at node Y#659. Accordingly, under these conditions, there is no Miller-effect increase in the capacitive loading on REFCLK 613.

Figure 8:
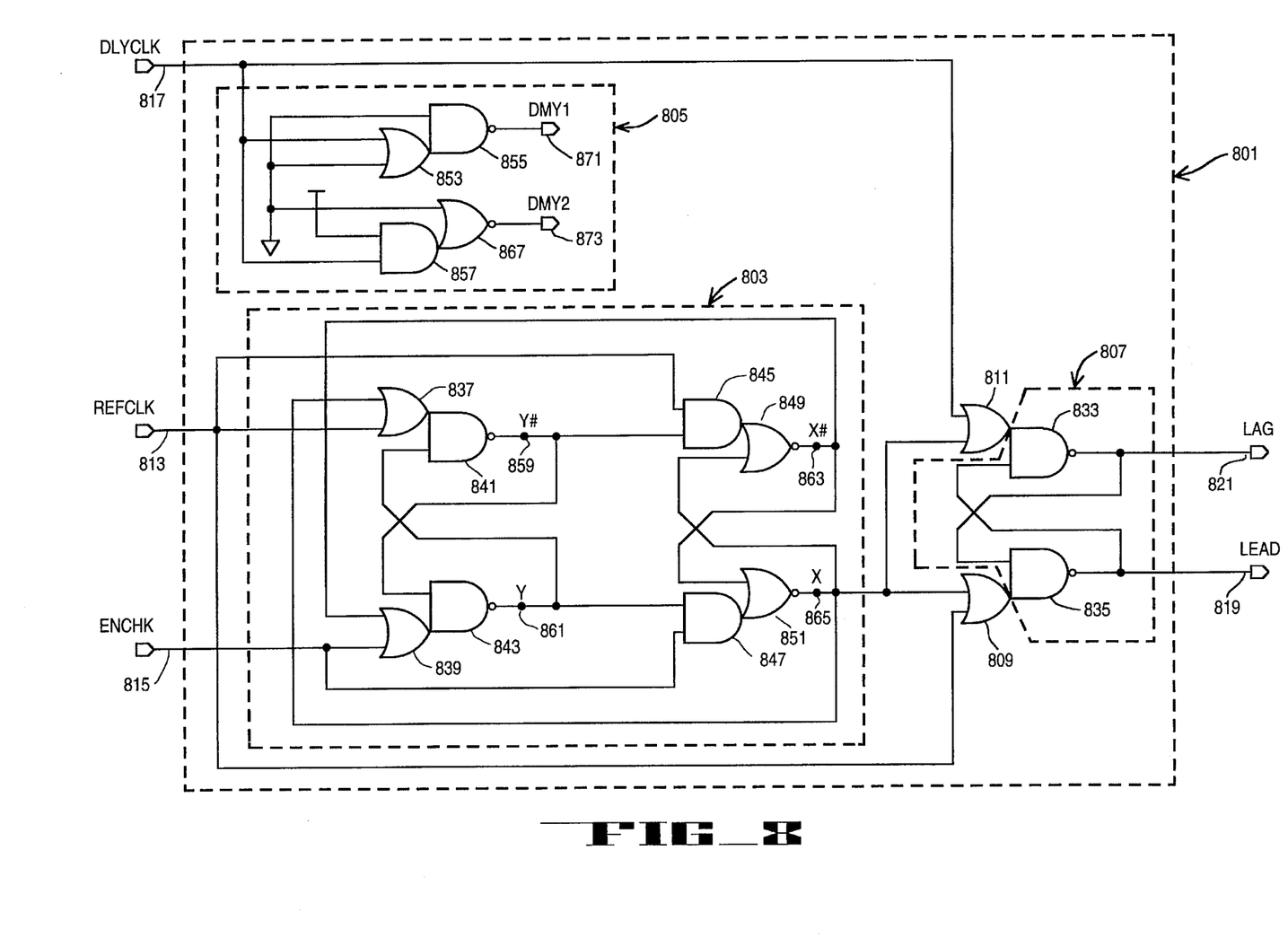
FIG. 8 is a schematic of an alternative embodiment of the present invention.

FIG. 8 shows a schematic of an alternate embodiment of the present invention as phase detector 801. Phase detector 801 is logically identical to phase detector 601, and is provided as another of the several possible alternate implementations of phase detector 601. Control block circuit 803 includes a pair of cross-coupled logical-NAND gates, 841 and 843, and a pair of cross-coupled logical-NOR gates 849 and 851. Logical-NAND gate 841 is also coupled to receive the output of logical-OR gate 837 and logical-NAND gate 843 is also coupled to receive the output of logical-OR gate 839. Logical-OR gate 837 is coupled to receive REFCLK 813 and the output of logical-NOR gate 851, and logical-OR gate 839 is coupled to receive ENCHK 815 and the output of logical-NOR gate 849. Logical-NOR gate 849 is also coupled to receive the output of logical-AND gate 845 and logical-NOR gate 851 is also coupled to receive the output of logical-AND gate 847. Logical-AND gate 845 is coupled to receive REFCLK 813 and the output of logical-NAND gate 841. Logical-AND gate 847 is coupled to receive ENCHK 815 and the output of logical-NAND gate 843.

Similar to phase detector 601 of FIG. 6, the output of logical-NAND gate 841 of FIG. 8 is denoted to be node Y#859, the output of logical-NAND gate 843 is denoted to be Y 861, the output of logical-NOR gate 849 is denoted to be X#863, and the output of logical-NOR gate 851 is denoted to be X 865. The output of logical-NOR gate 851 also corresponds with EN 527 of FIG. 5. Thus, the output of logical-NOR gate 851 is coupled to inputs of logical-OR gates 809 and 811. Logical-OR gate 809 is also coupled to receive REFCLK 813 and logical-OR gate 811 is further coupled to receive DLYCLK 817.

Like set-reset flip-flop 607 of FIG. 6, set-reset flip-flop 807 of FIG. 8 includes cross-coupled logical-NAND gates 833 and 835. Logical-NAND gate 833 is also coupled to receive the output of logical-OR gate 811 and logical-NAND gate 835 is also coupled to receive the output of logical-OR gate 809. LAG 821 is output by logical-NAND gate 833 and LEAD 819 is output by logical-NAND gate 835.

Dummy load 805 of phase detector 801 is implemented using logical-OR, NAND, AND, and NOR gates 853, 855, 857, and 867, respectively. DLYCLK 817 is coupled to the inputs of logical-OR gate 853 and logical-AND gate 857. The output of logical-OR gate 853 is coupled to an input of logical-NAND gate 855, and the output of logical-AND gate 857 is coupled to an input of logical-NOR gate 867. An input of logical-NAND gate 855, an input of logical-OR gate 853, and an input of logical-NOR gate 867 are coupled to $V_{ss}$, and an input of logical-AND gate 857 is coupled to $V_{cc}$. The outputs of logical-NAND gate 855 and logical-NOR gate 867, DMY1 871 and DMY2 873, respectively, are unused.

Similar to dummy load 605 of FIG. 6, the logical-OR, NAND, AND, and NOR gates 853, 855, 857, and 867 used in dummy load 805 of FIG. 8 to load DLYCLK 817 are a replica of logical-OR, NAND, AND, and NOR gates 837, 841, 845, and 849, which are coupled to REFCLK 813. When the "critical" low level to high level transition occurs on REFCLK 813, both nodes Y 861 and X 865 are at low levels, and node Y#859 is at a high level, or Y 861="0", X 865="0", and Y#859="1". Thus, in order to equalize the parasitic load on DLYCLK 817 created by gates 853, 855, 857, and 867, with the parasitic load on REFCLK 813 created by gates 837, 841, 845, and 849, during the low level to high level transition of REFCLK 813, the corresponding inputs of logical-OR, NAND, and NOR gates 853, 855, and 867 are coupled to $V_{ss}$, and the corresponding input of logical-AND gate 857 is coupled to $V_{cc}$.

Like control block circuit 603 of FIG. 6, control block circuit 803 of FIG. 8 is also implemented as an asynchronous state machine whose operation can be understood with reference to the state-transition diagram of FIG. 7. The logic levels at nodes Y 861 and X 865 at a particular time can also be considered as the corresponding state variables for the state-transition diagram of FIG. 7.

Figure 9:
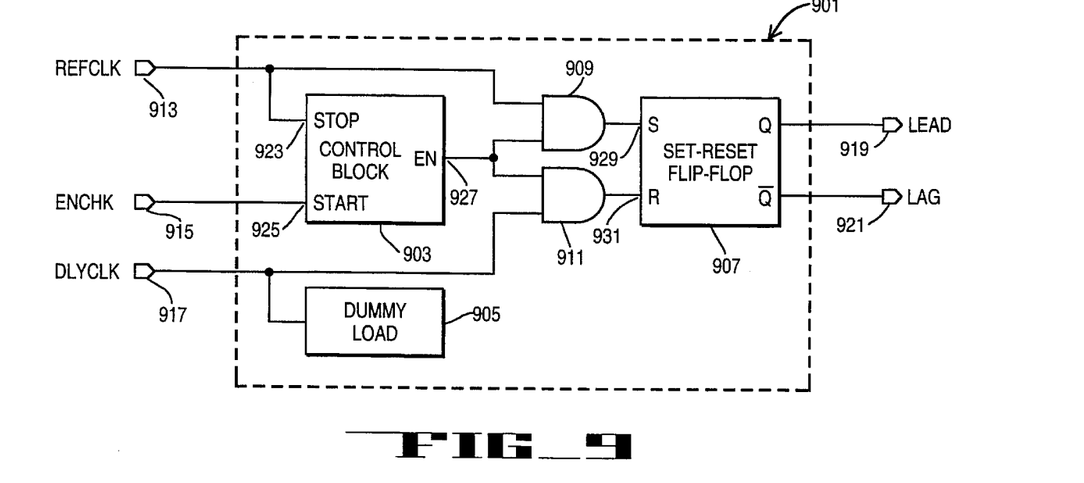
FIG. 9 is a block diagram of another alternative embodiment of the present invention implemented as a falling edge phase detector.

FIG. 9 shows a block diagram of phase detector 901 which is another alternate embodiment of the present invention. Phase detector 901 is similar to phase detector 501, but different in that phase detector 901 detects the phase difference between falling edges instead of rising edges of a reference clock signal and a delayed clock signal. The reference clock signal, REFCLK 913, the delayed clock signal, DLYCLK 917, and an enable check signal, ENCHK 915, are input to the phase detector 901 and corresponding LEAD 919 and LAG 921 signals are output. Phase detector 901 includes a control block circuit 903 which provides an active high enable signal, EN 927, to a set-reset flip-flop 907 through logical-AND gates 909 and 911. The set-reset flip-flop 907 has active high inputs S 929 (set) and R 931 (reset), S 929 receives input from logical-AND gate 909, and R 931 receives input from logical-AND gate 911. Logical-AND gate 909 is coupled to receive input from REFCLK 913 and EN 927, and logical-AND gate 911 is coupled to receive input from DLYCLK 917 and EN 927. Control block circuit 903 is coupled to receive REFCLK 913 as input at STOP 923, and ENCHK 915 as input at START 925. Dummy load 905 is coupled to DLYCLK 917 in order to equalize the parasitic loads on the two signals REFCLK 913 and DLYCLK 917.

Operation of phase detector 901 is as follows. Control block 903 maintains EN 927 as inactive, or at a low logic level, until a high logic level is received on the ENCHK 915 line. With EN 927 at a low logic level, the S 929 and R 931 inputs receive low logic levels from logical-AND gates 909 and 911, independent of the input signals on REFCLK 913 and DLYCLK 917. Thus, with both S 929 and R 931 receiving low logic levels, the set-reset flip-flop 903 maintains its previous state indefinitely.

When a low to high logic level transition is detected at ENCHK 915, control block circuit 903 then outputs an active, or high logic level, at EN 927. Accordingly, logical-AND gates 909 and 911 receive "1's" from EN 927, and the set-reset flip-flop 907 inputs S 929 and R 931 are therefore able to sample the REFCLK 913 and DLYCLK 917 signals. Control block 903 is unable, however, to deactivate EN 927 back to a "0" until a high to low level transition is detected on REFCLK 913. Thus, control block circuit 903 monitors REFCLK 913 for a high level logic signal. When the high level logic signal is detected on REFCLK 913, phase detection between REFCLK 913 and DLYCLK 917 continues, and the LEAD 919 and LAG 921 outputs are updated accordingly.

A subsequent high level to low level transition of REFCLK 913 captures the existing status of the LEAD 919 and LAG 921 output signals. If the waveform on DLYCLK 917 is at a low logic level, or has the high to low logic level transition before REFCLK 913 has a high to low logic level transition, then the LEAD 919 output is set to a high logic level and the LAG 921 output is set to a low logic level. In this instance, the waveform on DLYCLK 917 leads the waveform on REFCLK 913. If, on the other hand, there is a high to low logic level transition on REFCLK 913 before there is a high to low logic level transition on DLYCLK 917, then the LEAD 919 output is set to a low logic level and the LAG 921 output is set to a high logic level. In this instance, the waveform on DLYCLK 917 lags the waveform on REFCLK 913.

When control block circuit 903 detects the high logic level to low logic level transition on REFCLK 913, control block circuit 903 deactivates EN 927 by lowering the output from a high to a low logic level. As a result, logical-AND gates 909 and 911 receive "0's" from EN 927, and set-reset flip-flop 907 stops sampling the REFCLK 913 and DLYCLK 917 waveforms at the S 929 and R 931 inputs. Therefore, LEAD 919 and LAG 921 outputs remain fixed at their respective values from the time of the high to low level transition of REFCLK 913 until the next low to high level transition of ENCHK 915.

In sum, falling edge phase detector 901 differs from phase detector 501 in that logical-OR gates 509 and 511 of phase detector 501 are replaced in phase detector 901 with logical-AND gates 909 and 911, and the set-reset flip-flop inputs 529 and 531 are changed from active low to active high set-reset flip-flop inputs 929 and 931. Control block circuit 503 output $\overline{EN}$ 527 is changed from active low to active high output EN 927. In addition, EN 927 is deactivated by the high to low level transition of REFCLK 913, whereas $\overline{EN}$ 527 is deactivated by the low to high transition of REFCLK 513.

Figure 10:
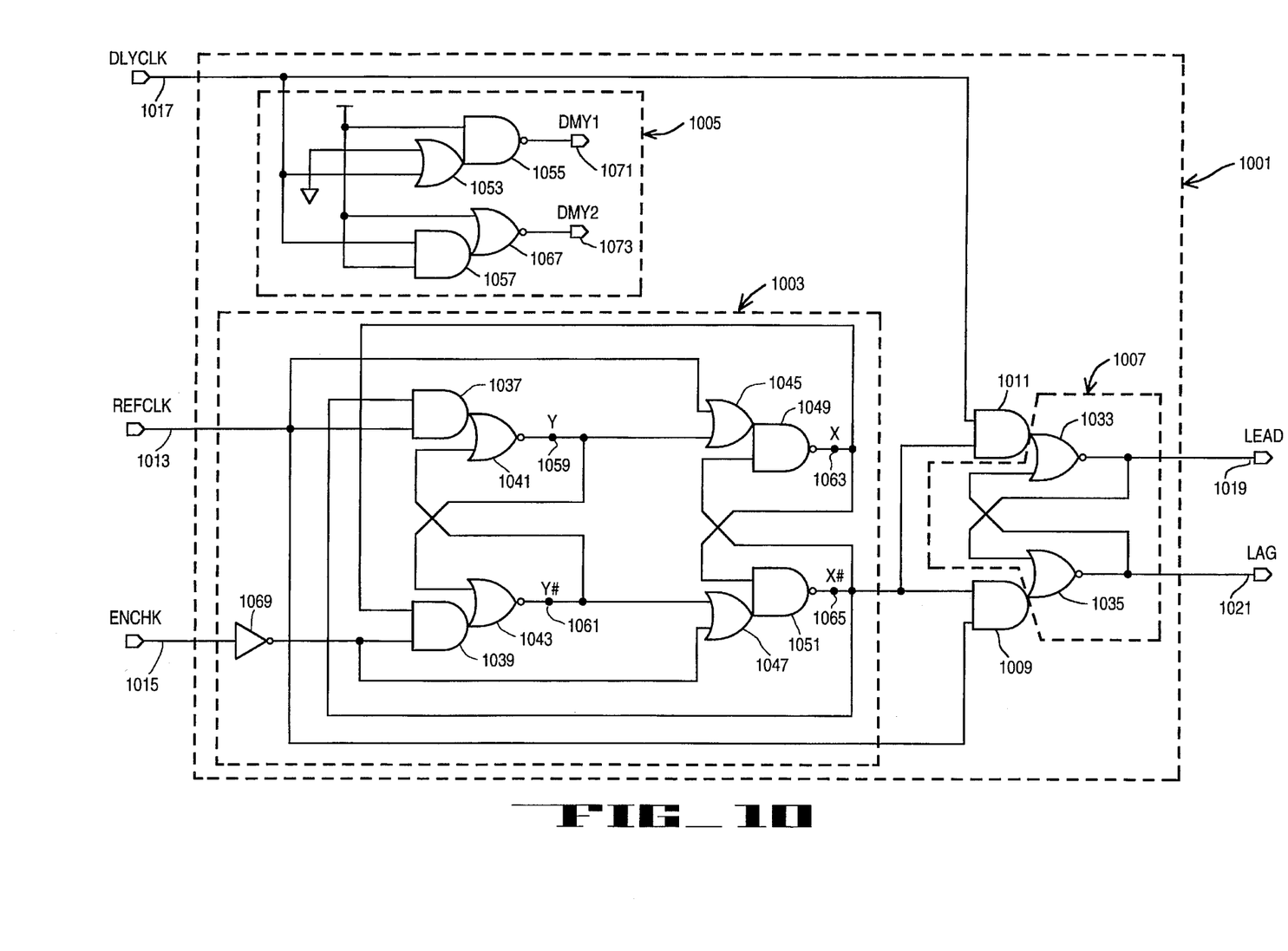
FIG. 10 is a schematic of the alternative embodiment of the present invention implemented as a falling-edge phase detector.

A schematic of an implementation of falling edge phase detector 1001 is shown in FIG. 10. Control block circuit 1003 includes a pair of cross-coupled logical-NOR gates, 1041 and 1043, and a pair of cross-coupled logical-NAND gates 1049 and 1051. Logical-NOR gate 1041 is also coupled to receive the output of logical-AND gate 1037, and logical-NOR gate 1043 is also coupled to receive the output of logical-AND gate 1039. Logical-AND gate 1037 is coupled to receive REFCLK 1013 and the output of logical-NAND gate 1051, and logical-AND gate 1039 is coupled to receive the output of logical-NOT gate 1069 and the output of logical-NAND gate 1049. Logical-NOT gate 1069 is coupled to receive ENCHK 1015. Logical-NAND gate 1049 is also coupled to receive the output of logical-OR gate 1045, and logical-NAND gate 1051 is also coupled to receive the output of logical-OR gate 1047. Logical-OR gate 1045 is coupled to receive REFCLK 1013 and the output of logical-NOR gate 1041. Logical-OR gate 1047 is coupled to receive the outputs of logical-NOR gate 1043 and logical-NOT gate 1069.

As shown in FIG. 10, the output of logical-NOR gate 1041 is denoted to be node Y 1059, the output of logical-NOR gate 1043 is denoted to be Y#1061, the output of logical-NAND gate 1049 is denoted to be X 1063, and the output of logical-NAND gate 1051 is denoted to be X#1065. The output of logical-NAND gate 1051 also corresponds with EN 927 of FIG. 9. Thus, the output of logical-NAND gate 1051 is coupled to inputs of logical-AND gates 1009 and 1011. Logical-AND gate 1009 is also coupled to receive REFCLK 1013, and logical-AND gate 1011 is further coupled to receive DLYCLK 1017.

Set-reset flip-flop 1007 includes cross-coupled logical-NOR gates 1033 and 1035. Logical-NOR gate 1033 is also coupled to receive the output of logical-AND gate 1011, and logical-NOR gate 1035 is also coupled to receive the output of logical-AND gate 1009. LAG 1021 is output by logical-NOR gate 1035 and LEAD 1019 is output by logical-NOR gate 1033.

Dummy load 1005 is implemented using logical-OR, NAND, AND, and NOR gates 1053, 1055, 1057 and 1067, respectively. DLYCLK 1017 is coupled to the inputs of logical-OR gate 1053 and logical-AND gate 1057. The output of logical-OR gate 1053 is coupled to an input of logical-NAND gate 1055, and the output of logical-AND gate 1057 is coupled to an input of logical-NOR gate 1067. An input of logical-OR gate 1053 is coupled to $V_{ss}$, and inputs of logical-NAND gate 1055, logical-AND gate 1057, and logical-NOR gate 1067 are coupled to $V_{cc}$. The outputs of logical-NAND gate 1055 and logical-NOR gate 1067, DMY1 1071 and DMY2 1073, respectively, are unused.

The logical-OR, NAND, AND, and NOR gates 1053, 1055, 1057, and 1067 used in dummy load 1005 to load DLYCLK 1017 are a replica of logical-OR, NAND, AND, and NOR gates 1045, 1049, 1037, and 1041, respectively, which are coupled to REFCLK 1013. When the "critical" high level to low level transition occurs on REFCLK 1013, both nodes Y#1061 and X#1065 are at high levels, and node Y 1059 is at a low level, or Y#1061="1", X#1065="1", and Y 1059="0". To equalize the load between the parasitic load on DLYCLK 1017 created by gates 1053, 1055, 1057, and 1067, with the parasitic load on REFCLK 1013 created by gates 1045, 1049, 1037, and 1041, during a high to low level transition of REFCLK 1013, the corresponding inputs of logical-OR, NAND, AND, and NOR gates 1053, 1055, 1057, and 1067 are biased to be the same as their counterpart gates 1045, 1049, 1037, and 1041 during the REFCLK 1013 high to low level transition.

Figure 11:
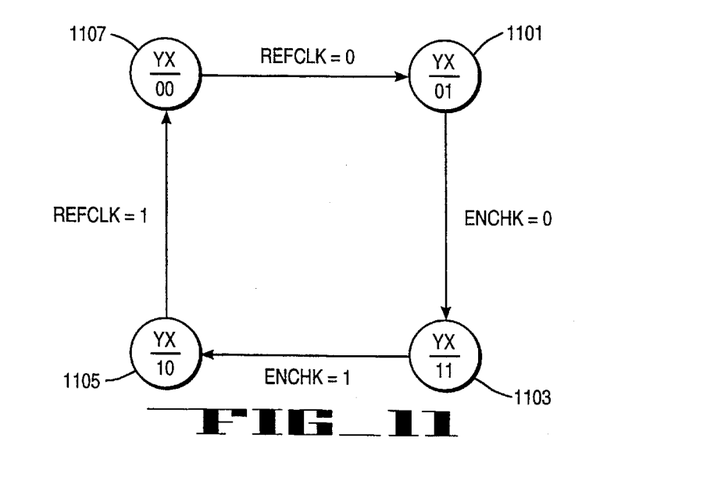
FIG. 11 is a state-transition diagram of the present invention implemented as a falling edge phase detector.

Control block 1003 of falling edge phase detector 1001 is implemented as an asynchronous state machine whose operation can be understood with reference to the state-transition diagram of FIG. 11. The diagram includes four possible states of the control logic denoted by circles 1101, 1103, 1105, and 1107. Circles 1101, 1103, 1105, and 1107 contain the values for Y 1059 and X 1063 for the particular state. The arrows between each of the circles indicate possible state transitions with corresponding input signal values for ENCHK 1015 and REFCLK 1013 which will cause the transition indicated by the associated arrow.

As shown in FIG. 11, control block 1003 transitions from state 1101 to state 1103 when a low logic level is detected on ENCHK 1015, or ENCHK 1015=0. While in state 1101, Y 1061 is at a low logic level, or Y 1059=0, and X 1063 is at a high logic level, or X 1063=1. After control block 1003 transitions to state 1103, Y 1059=1 and X 1063=1. Control block 1003 transitions to state 1105 when a high logic level is detected on ENCHK 1015, or ENCHK 1015=1. While in state 1105, Y 1059=1 and X 1063=0. Control block 1003 transitions to state 1107 when a high level signal is detected on REFCLK 1013, or REFCLK 1013=1. While in state 1107, Y 1059=0 and X 1063=0. Finally, control block 1003 then transitions back to state 1101 when a low logic level is detected on REFCLK 1013, or REFCLK 1013=0.

Accordingly, it is observed that X 1063 transitions from high to low when there is a low to high transition of ENCHK 1015. Further, X 1063 transitions from low back to high when there is a high to low transition on REFCLK 1013. Accordingly, the EN 927 output of control block 903 is equivalent to the inverse of X 1063, of falling edge phase detector 1001

Thus, a phase detector with edge-sensitive enable and disable is described. The phase detector and the alternative embodiments described herein provide symmetric edge-sensitive phase detection circuits for detecting a phase relationship between a reference clock signal and a delayed clock signal using an enable check signal. Although the present invention has been described in terms of a preferred embodiment, it will be appreciated that various modifications and alterations might be made by those skilled in the art without departing from the spirit and scope of the present invention.

I claim:

1. An integrated circuit for detecting a phase relationship between a reference clock signal and a delayed clock signal, the integrated circuit comprising:

a control block circuit coupled to the reference clock signal, the control block circuit generating an enable signal;

a phase detection circuit coupled to the reference clock signal, the delayed clock signal, and the enable signal, the phase detection circuit having symmetric processing for the reference clock signal and the delayed clock signal; and an enable check signal coupled to the control block circuit, wherein the enable signal is activated from an inactive state only in response to a first to second logic level transition of the enable check signal, wherein the enable signal is deactivated from an active state only in response to a first to second logic level transition of the reference clock signal, the integrated circuit detecting the phase relationship between the reference clock signal and delayed clock signal only in response to the enable signal.

2. The integrated circuit described in claim 1 wherein the control block circuit loads the reference clock signal with a predetermined parasitic load value.

3. The integrated circuit described in claim 2 wherein a dummy load having the predetermined parasitic load value is coupled to the delayed clock signal.

4. The integrated circuit described in claim 3 wherein the phase detection circuit includes a set-reset flip-flop having a first and second input, and a first and second output.

5. The integrated circuit described in claim 4 wherein the first input of the set-reset flip-flop is coupled to receive input from a first logic gate, the second input of the set-reset flip-flop is coupled to receive input from a second logic gate, the first logic gate coupled to receive the delayed clock signal and the enable signal, the second logic gate coupled to receive the reference clock signal and the enable signal.

6. The integrated circuit described in claim 5 wherein the first and second outputs indicate the phase relationship between a reference clock signal and a delayed clock signal.

7. The integrated circuit described in claim 6 wherein the phase detection circuit generates an inactive lead signal and an active lag signal if the delayed clock signal is at a low level when the reference clock signal has a low level to high level transition.

8. The integrated circuit described in claim 7 wherein the phase detection circuit generates an active lead signal and an inactive lag signal if the delayed clock signal is at a high level when the reference clock signal has the low level to high level transition.

9. The integrated circuit described in claim 8 wherein the control block circuit has a first state such that the control block circuit outputs an inactive and high level enable signal when the control block circuit is in the first state.

10. The integrated circuit described in claim 9 wherein the control block circuit transitions from the first state to a second state when the control block circuit detects a low level enable check signal, the control block circuit outputting the inactive and high level enable signal while the control block circuit is in the second state.

11. The integrated circuit described in claim 10 wherein the control block circuit transitions from the second state to a third state when the control block circuit detects a high level on the enable check signal, the control block circuit outputting an active and low level enable signal while the control block circuit is in the third state.

12. The integrated circuit described in claim 11 wherein the control block circuit transitions from the third state to a fourth state when the control block circuit detects a low level reference clock signal, the control block circuit outputting the active and low level enable signal while the control block circuit is in the fourth state.

13. The integrated circuit described in claim 12 wherein the control block circuit transitions from the fourth state to the first state when the control block circuit detects a high level on the reference clock signal.

14. The integrated circuit described in claim 13 wherein the first and second logic gates are logical-OR gates.

15. The integrated circuit described in claim 14 wherein the set-reset flip-flop is comprised of a first pair of cross-coupled logical-NAND gates, one of the first pair of cross-coupled logical-NAND gates receiving input from the first logic gate, and the other one of the first pair of cross-coupled logical-NAND gates receiving input from the second logic gate.

16. The integrated circuit described in claim 15 wherein the control block circuit comprises a first logical-OR gate coupled to receive the reference clock signal;

a second logical-OR gate coupled to receive the enable check signal;

a second pair of cross-coupled logical-NAND gates, one of the second pair of cross-coupled logical-NAND gates receiving input from the first logical-OR gate and generating a first intermediate control signal, the other one of the second pair of cross-coupled logical-NAND gates receiving input from the second logical-OR gate and generating a second intermediate control signal;

a first logical-NOT gate coupled to receive the enable check signal;

a second logical-NOT gate coupled to receive the reference clock signal;

a third logical-OR gate coupled to receive the first intermediate control signal and an output from the first logical-NOT gate;

a fourth logical-OR gate coupled to receive the second intermediate control signal and an output from the second logical-NOT gate; and a third pair of cross-coupled logical-NAND gates, one of the third pair of cross-coupled logical-NAND gates receiving input from the third logical-OR gate and generating a third intermediate control signal, the other one of the third pair of cross-coupled logical-NAND gates receiving input from the fourth logical-OR gate and generating a fourth intermediate control signal, the third intermediate control signal input to the second logical-OR gate and the fourth intermediate control signal input to the first logical-OR gate and the phase detection circuit.

17. The integrated circuit described in claim 16 wherein the fourth intermediate control signal is the enable signal.

18. The integrated circuit described in claim 17 wherein the dummy load comprises:

a fifth logical-OR gate coupled to the delayed clock signal line;

a third logical-NOT gate coupled to the delayed clock signal line; and a first logical-NAND gate coupled to receive input from the fifth logical-OR gate.

19. The integrated circuit described in claim 18 wherein the fifth logical-OR gate and the first logical-NAND gate are further coupled to receive input from a first potential.

20. The integrated circuit described in claim 19 wherein the first potential is $V_{ss}$.

21. The integrated circuit described in claim 15 wherein the control block circuit comprises a sixth logical-OR gate coupled to receive the reference clock signal;

a seventh logical-OR gate coupled to receive the enable check signal;

a fourth pair of cross-coupled logical-NAND gates, one of the fourth pair of cross-coupled logical-NAND gates receiving input from the sixth logical-OR gate and generating a fifth intermediate control signal, the other one of the fourth pair of cross-coupled logical-NAND gates receiving input from the seventh logical-OR gate and generating a sixth intermediate control signal;

a first logical-AND gate coupled to receive the fifth intermediate control signal and the reference clock signal;

a second logical-AND gate coupled to receive the sixth intermediate control signal and the enable check signal; and a first pair of cross-coupled logical-NOR gates, one of the first pair of cross-coupled logical-NOR gates receiving input from the first logical-AND gate and generating a seventh intermediate control signal, the other one of the first pair of cross-coupled logical-NOR gates receiving input from the second logical-AND gate and generating an eighth intermediate control signal, the seventh intermediate control signal input to the seventh logical-OR gate and the eighth intermediate control signal input to the sixth logical-OR gate and the phase detection circuit.

22. The integrated circuit described in claim 21 wherein the eighth intermediate control signal is the enable signal.

23. The integrated circuit described in claim 22 wherein the dummy load comprises:

an eighth logical-OR gate coupled to the delayed clock signal line;

a third logical-AND gate coupled to the delayed clock signal line;

a second logical-NAND gate coupled to receive input from the eighth logical-OR gate; and a first logical-NOR gate coupled to receive input from the third logical-AND gate.

24. The integrated circuit described in claim 23 wherein the eighth logical-OR gate, the second logical-NAND gate, and the first logical-NOR gate are further coupled to receive input from a first potential, and the third logical-AND gate is further coupled to receive input from a second potential.

25. The integrated circuit described in claim 24 wherein the first potential is $V_{ss}$ and the second potential is $V_{cc}$.

26. The integrated circuit described in claim 6 wherein the phase detection circuit generates an inactive lead signal and an active lag signal if the delayed clock signal is at a high level when the reference signal has a high level to low level transition.

27. The integrated circuit described in claim 26 wherein the phase detection circuit generates an active lead signal and an inactive lag signal if the delayed clock signal is at a low level when the reference clock signal has the high level to low level transition.

28. The integrated circuit described in claim 27 wherein the control block circuit has a first state such that the control block circuit outputs an inactive and low level enable signal when the control block circuit is in the first state.

29. The integrated circuit described in claim 28 wherein the control block circuit transitions from the first state to a second state when the control block circuit detects a low level enable check signal, the control block circuit outputting the inactive and low level enable signal while the control block circuit is in the second state.

30. The integrated circuit described in claim 29 wherein the control block circuit transitions from the second state to a third state when the control block circuit detects a high level on the enable check signal, the control block circuit outputting an active and high level enable signal while the control block circuit is in the third state.

31. The integrated circuit described in claim 30 wherein the control block circuit transitions from the third state to a fourth state when the control block circuit detects a high level reference clock signal, the control block circuit outputting the active and high level enable signal while the control block circuit is in the fourth state.

32. The integrated circuit described in claim 31 wherein the control block circuit transitions from the fourth state to the first state when the control block circuit detects a low level on the reference clock signal.

33. The integrated circuit described in claim 32 wherein the first and second logic gates are logical-AND gates.

34. The integrated circuit described in claim 33 wherein the set-reset flip-flop is comprised of a second pair of cross-coupled logical-NOR gates, one of the second pair of cross-coupled logical-NOR gates receiving input from the first logic gate, and the other one of the second pair of cross-coupled logical-NOR gates receiving input from the second logic gate.

35. The integrated circuit described in claim 34 wherein the control block circuit comprises a fourth logical-AND gate coupled to receive the reference clock signal;

a fourth logical-NOT gate coupled to receive the enable check signal;

a fifth logical-AND gate coupled to receive input from the fourth logical-NOT gate;

a third pair of cross-coupled logical-NOR gates, one of the third pair of cross-coupled logical-NOR gates receiving input from the fourth logical-AND gate and generating a ninth intermediate control signal, the other one of the third pair of cross-coupled logical-NOR gates receiving input from the fifth logical-AND gate and generating a tenth intermediate control signal;

a ninth logical-OR gate coupled to receive the ninth intermediate control signal and the reference clock signal;

a tenth logical-OR gate coupled to receive the tenth intermediate control signal and input from the fourth logical-NOT gate; and a fifth pair of cross-coupled logical-NAND gates, one of the fifth pair of cross-coupled logical-NAND gates receiving input from the ninth logical-OR gate and generating an eleventh intermediate control signal, the other one of the fifth pair of cross-coupled logical-NAND gates receiving input from the tenth logical-OR gate and generating a twelfth intermediate control signal, the eleventh intermediate control signal input to the fifth logical-AND gate and the twelfth intermediate control signal input to the fourth logical-AND gate and the phase detection circuit.

36. The integrated circuit described in claim 35 wherein the twelfth intermediate control signal is the enable signal.

37. The integrated circuit described in claim 36 wherein the dummy load comprises:

an eleventh logical-OR gate coupled to the delayed clock signal line;

a sixth logical-AND gate coupled to the delayed clock signal line;

a third logical-NAND gate coupled to receive input from the eleventh logical-OR gate; and a second logical-NOR gate coupled to receive input from the sixth logical-AND gate.

38. The integrated circuit described in claim 37 wherein the eleventh logical-OR gate is further coupled to receive input from a first potential, and the sixth logical-AND gate, the second logical-NOR gate, and the third logical-NAND gate are further coupled to receive input from a second potential.

39. The integrated circuit described in claim 38 wherein the first potential is $V_{ss}$ and the second potential is $V_{cc}$.

40. A method for detecting a phase relationship between a reference clock signal and a delayed clock signal comprising the steps of:

receiving an enable check signal and the reference clock signal with a control block;

generating an enable signal with the control block in response to the enable check signal and the reference clock signal, the generating step including the steps of:
activating the enable signal from an inactive state only in response to a first to second logic level transition of the enable check signal; and
deactivating the enable signal from an active state only in response to a first to second logic level transition of the reference clock signal;

receiving the reference clock signal, the delayed clock signal, and the enable signal with a phase detector, the phase detector having symmetric processing for the reference clock signal and the delayed clock signal; and determining the phase relationship between the reference clock signal and the delayed clock signal with the phase detector only in response to the enable signal.

41. The method described in claim 40 wherein the step of activating the enable signal from the inactive state is performed only in response to a low level to high level transition of the enable check signal.

42. The method described in claim 41 including the additional step of updating a lead signal and a lag signal with the phase detection circuit while the enable signal is active.

43. The method described in claim 42 including the additional step of maintaining the lead signal and the lag signal while the enable signal is inactive.

44. The method described in claim 43 wherein the enable signal has the active to inactive transition in response to a low level to high level transition of the reference clock signal.

45. The method described in claim 44 including the additional step of generating a high level lag signal and a low level lead signal if the delayed clock signal is at a low level when the enable signal is active and the reference clock signal has the low level to high level transition.

46. The method described in claim 45 including the additional step of generating a low level lag signal and a high level lead signal if the delayed clock signal is at a high level when the enable signal is active and the reference clock signal has the low level to high level transition.

47. The method described in claim 43 wherein the enable signal has the active to inactive transition in response to a high level to low level transition of the reference clock signal.

48. The method described in claim 47 including the additional step of generating a low level lag signal and a high level lead signal if the delayed clock signal is at a low level when the enable signal is active and the reference clock signal has the high level to low level transition.

49. The method described in claim 48 including the additional step of generating a high level lag signal and a low level lead signal if the delayed clock signal is at a high level when the enable signal is active and the reference clock signal has the high level to low level transition.

* * * * *